(12) United States Patent
Mann, III et al.

(10) Patent No.: US 8,152,201 B2
(45) Date of Patent: Apr. 10, 2012

(54) GROUND SUPPORT SYSTEM

(75) Inventors: James W. Mann, III, Saint Petersburg, FL (US); Richard L. Hansen, Parrish, FL (US); David Wayne Leadingham, Bradenton, FL (US)

(73) Assignee: Illinois Tool Works, Inc., Glenview, IL (US)

( * ) Notice: Subject to any disclaimer, the term of this patent is extended or adjusted under 35 U.S.C. 154(b) by 847 days.

(21) Appl. No.: 12/251,598

(22) Filed: Oct. 15, 2008

(65) Prior Publication Data

US 2009/0108128 A1 Apr. 30, 2009

Related U.S. Application Data

(60) Provisional application No. 60/982,578, filed on Oct. 25, 2007.

(51) Int. Cl.
*B60P 3/22* (2006.01)
*B64D 41/00* (2006.01)

(52) U.S. Cl. ......... 280/836; 280/839; 244/1 R; 244/1 N; 244/58

(58) Field of Classification Search .................. 244/1 R, 244/1 N, 58; 280/836, 839
See application file for complete search history.

(56) References Cited

U.S. PATENT DOCUMENTS

| | | |
|---|---|---|
| 6,933,932 B2 | 8/2005 | Knowles |
| 7,053,529 B2 | 5/2006 | Knowles |
| 7,106,310 B2 | 9/2006 | Knowles |
| 2002/0126103 A1 | 9/2002 | Knowles |
| 2002/0126104 A1 | 9/2002 | Knowles |
| 2002/0149570 A1 | 10/2002 | Knowles |
| 2004/0227740 A1 | 11/2004 | Knowles |
| 2004/0246239 A1 | 12/2004 | Knowles |
| 2008/0250803 A1 * | 10/2008 | Leadingham et al. .......... 62/236 |

FOREIGN PATENT DOCUMENTS

WO 2007050310 5/2007

OTHER PUBLICATIONS

ITW Military GSE: "CGAC/20T400MP-TMD-1: Diesel Powered Combined Generator/Air Conditioner.", update date Feb. 18, 2008.
International Search Report and Written Opinion for PCT/US2008/080575, May 26, 2009.

* cited by examiner

*Primary Examiner* — Paul N Dickson
*Assistant Examiner* — Marlon Arce
(74) *Attorney, Agent, or Firm* — Joseph M. Butscher; The Small Patent Law Group, LLC

(57) ABSTRACT

A ground support system configured to support servicing of aircraft may include a main body housing one or both of an engine and/or a blower, a control panel that is used to control operation of one or both of the engine and/or blower, and at least one acoustic wave engagement member positioned on the control panel. The acoustic wave member(s) is configured to selectively activate and deactivate an engine or blower function when touched by an operator. The acoustic wave engagement member(s) operates in the presence of moisture and debris.

22 Claims, 5 Drawing Sheets

GROUND SUPPORT SYSTEM

RELATED APPLICATIONS

This application relates to and claims priority benefits from U.S. Provisional Patent Application No. 60/982,578 entitled "Active Touch Switch For Ground Support Equipment," filed Oct. 25, 2007, which is hereby incorporated by reference in its entirety.

FIELD OF EMBODIMENTS OF THE INVENTION

Embodiments of the present invention generally relate to ground support equipment for military and civilian aircraft, and more particularly to control panels of the ground support equipment.

BACKGROUND

Ground support equipment is used to service aircraft at airports. Fueling carts, fluid exchangers (such as used with air conditioners, lubricants and the like) and a whole host of other such equipment may be used to service the aircraft. For example, a combination generator air conditioner (CGAC), such as Model CGAC/20T400MP-TMD-1 manufactured by ITW Military of Palmetto, Fla., is used to support flight line operations, servicing and maintenance consistent with local unit and organizational level aerospace ground support equipment functions and capabilities. A typical CGAC is an enclosed, self-contained, trailer mounted, diesel engine driven device. A combined engine/generator/air conditioner illuminated control panel is conveniently mounted on the CGAC behind a weather and dust proof transparent panel. Typically, the switches and buttons used with respect to the control panel are mechanical switches. As such, these switches are susceptible to mechanical failure from extended use and/or moisture infiltration (such as through rain and snow). Thus, the transparent panel is used to protect the switches.

At various times, a CGAC is washed to remove dirt, dust, sand, debris and the like. Moisture may infiltrate the control panel during the wash-down process. Further, moisture may infiltrate the control panel from the elements, despite the presence of the transparent panel. Moisture, debris and the like that infiltrate the control panel may damage the mechanical switches and buttons.

SUMMARY OF EMBODIMENTS OF THE INVENTION

Certain embodiments of the present invention provide a ground support system, such as a combination air generator/air conditioner, configured to support servicing of aircraft. The system may include a main body housing, one or both of an engine and/or a blower, a control panel that is used to control operation of the engine and/or blower, and at least one acoustic wave engagement member positioned on the control panel. The at least one acoustic wave engagement member is configured to selectively activate and deactivate an engine or blower function when touched by an operator. Unlike conventional mechanical switches on ground support systems, the at least one acoustic wave engagement member is effective in the presence of moisture and/or debris.

The acoustic wave engagement member may be one or both of a switch and/or a button. Further, the acoustic wave engagement member may include a substrate having an acoustic wave cavity, and a transducer mounted to the substrate. The transducer is configured to generate a trapped acoustic wave within the acoustic wave cavity. The at least one acoustic wave engagement member may also include a sensing circuit that detects a change in one of impedance or decay rate of a trapped acoustic wave within the at least one acoustic wave engagement member in order to determine if the at least one acoustic wave engagement member is being touched. The at least one acoustic wave engagement member is configured to switch between activated and deactivated states when the sensing circuit detects a touch of a predetermined pressure.

The system may be a cart in which the main body is supported by a frame connected to wheels. Further, unlike conventional ground support systems, the control panel may be devoid of a protective cover (such as a protective transparent panel), thereby providing easier access for operation and wash-down.

The system may be configured to self-diagnose a defective or potentially defective acoustic wave engagement member. For example, a processing unit may monitor the acoustic wave engagement member to detect any difference between a known, calibrated or acceptable response and an actual response. If the actual response varies from the known, calibrated or acceptable response, an error condition exists. If the actual response is within a particular tolerance, the system may issue an alert of a potential error. If the actual response is beyond the particular tolerance, then the system may issue an alert of an actual error.

Certain embodiments of the present invention provide a method of operating ground support equipment used to support aircraft servicing. The method includes contacting a switch of a control panel through a touch, detecting the contacting by measuring a change in impedance or decay rate of a trapped acoustic wave within an acoustic wave cavity of the switch, activating a servicing function (such as supplying oxygen/air and/or cooling agents to the cabin of an aircraft, supplying fuel to the aircraft, etc.) of the ground support equipment through the contacting when the servicing function is deactivated immediately prior to the contacting, and deactivating the servicing function of the ground support equipment through the contacting when the servicing function is activated immediately prior to the contacting.

The contacting may occur without squeezing (e.g., a trigger), flipping (e.g., a toggle) or pressing. Instead, an operator need only touch the switch.

The activating and deactivating may occur after a predetermined time contacting. For example, the activating and deactivating may occur after a user touches the switch for a period of 2 or 3 seconds. In this manner, inadvertent contact with the switches will not activate or deactivate them.

The activating and deactivating may occur when the contacting exceeds a predetermined amount of pressure. For example, instead of merely tapping the switch, the switch may be configured to activate/deactivate when a specific force is exerted into the switch. In this way, inadvertent taps or touches will not activate or deactivate the switch.

As noted above, the servicing function may include a wide variety of aircraft servicing functions. For example, the servicing function may include one or more of supplying fuel, providing lubricants, cleaning the aircraft and/or exchanging fluids with the aircraft.

Figure 1:
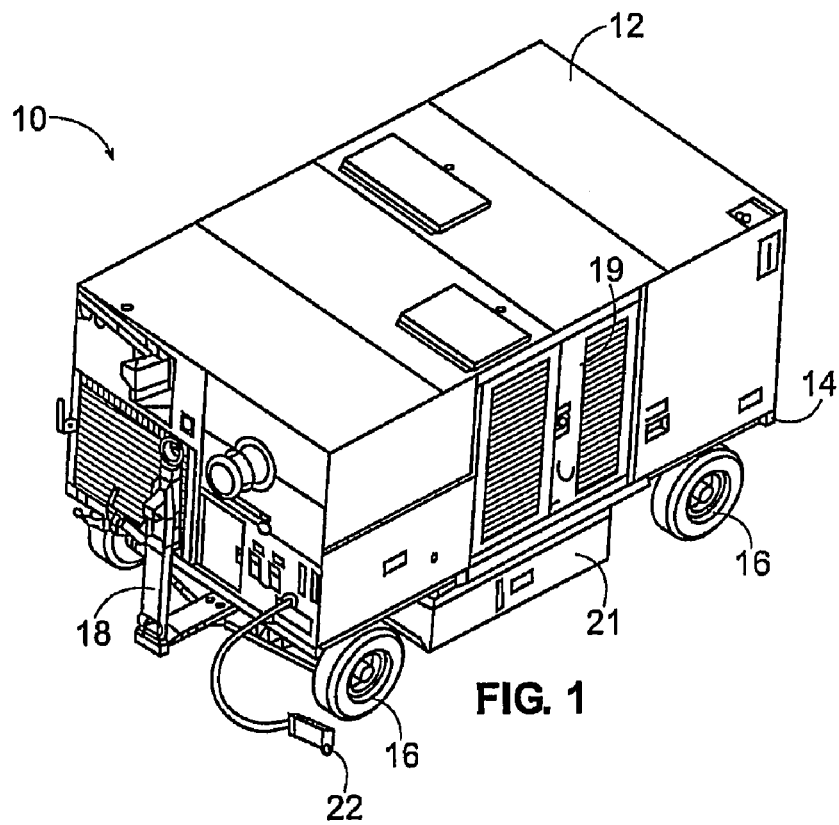
FIG. 1 illustrates an isometric top view of a first side of a ground support equipment cart, according to an embodiment of the present invention.

Before the embodiments of the invention are explained in detail, it is to be understood that the invention is not limited in its application to the details of construction and the arrangement of the components set forth in the following description or illustrated in the drawings. The invention is capable of other embodiments and of being practiced or being carried out in various ways. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof.

DETAILED DESCRIPTION OF EMBODIMENTS OF THE INVENTION

Figure 2:
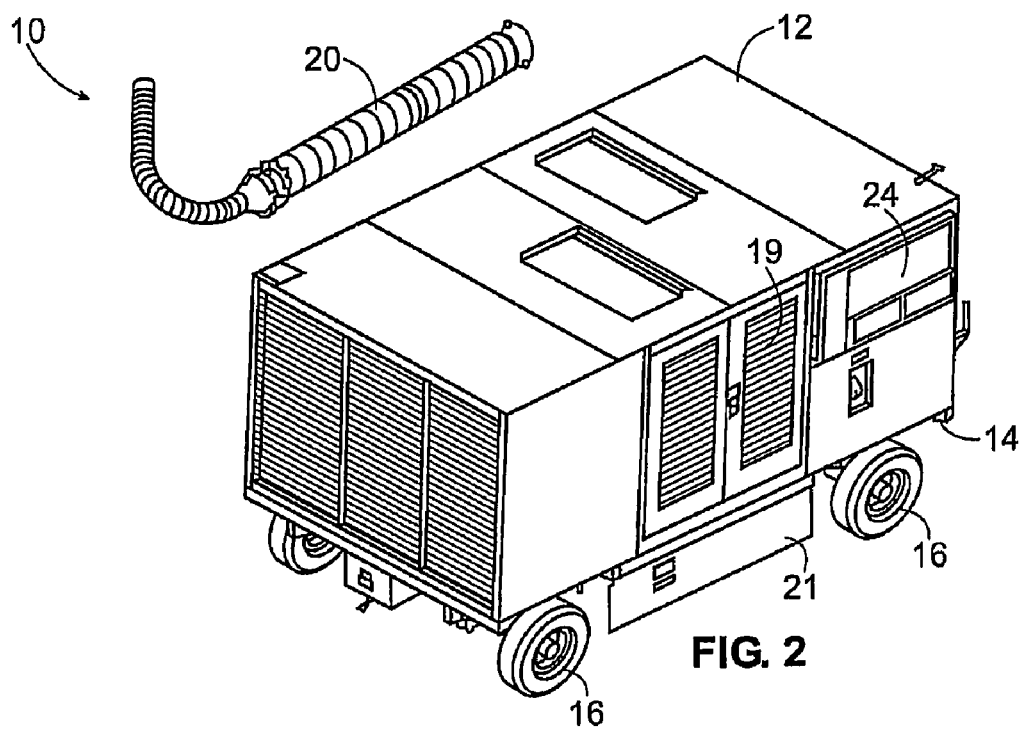
FIG. 2 illustrates an isometric top view of a second side of a ground support equipment cart, according to an embodiment of the present invention.

FIG. 1 illustrates an isometric top view of a first side of a ground support equipment cart 10. FIG. 2 illustrates an isometric top view of a second side of the ground support equipment cart 10. Referring to FIGS. 1 and 2, the ground support equipment cart 10 may be a combination air generator/air conditioner (CGAC) cart used for servicing aircraft at airports. For example, the cart 10 may be a combination generator air conditioner (CGAC), similar to Model CGAC/20T400MP-TMD-1 manufactured by ITW Military of Palmetto, Fla., which is used to support flight line operations, servicing and maintenance consistent with local unit and organizational level aerospace ground support equipment functions and capabilities. Alternatively, the cart 10 may be various other types of ground support equipment that are used to service aircraft, such a refueling cart, a cleaning cart having a vacuum, an aircraft washing cart or the like.

The cart 10 includes a main body 12 supported by a frame 14 that is in turn supported on a surface by wheels 16. A hitch 18 is connected to the frame 14 and is configured to allow the cart 10 to be hitched to and pulled by a vehicle (not shown).

The cart 10 may be enclosed, self-contained, trailer mounted and diesel engine driven. The main body 12 may be formed of aluminum sheet metal with a plurality of latching doors 19. The doors 19 provide ready access to refrigeration, engine assembly, radiator assembly, servo air, hydraulic and electric generator components. For example, the doors 19 shown in FIG. 1 may provide access to an engine and generator, while the doors 19 shown in FIG. 2 may provide access to a blower. A flexible air conditioner duct 20 may be stored in a cabinet 21 located within the cart 10.

An A/C output cable/connector 22 extends from the main body 12 and is configured to be removably secured to an aircraft to be serviced. A control panel 24 is positioned on an outer surface of the cart 10. The control panel 24 may be located at any portion of the cart 10 that allows for convenient access. The control panel 24 allows a user to operate and control the cart 10.

Figure 3:
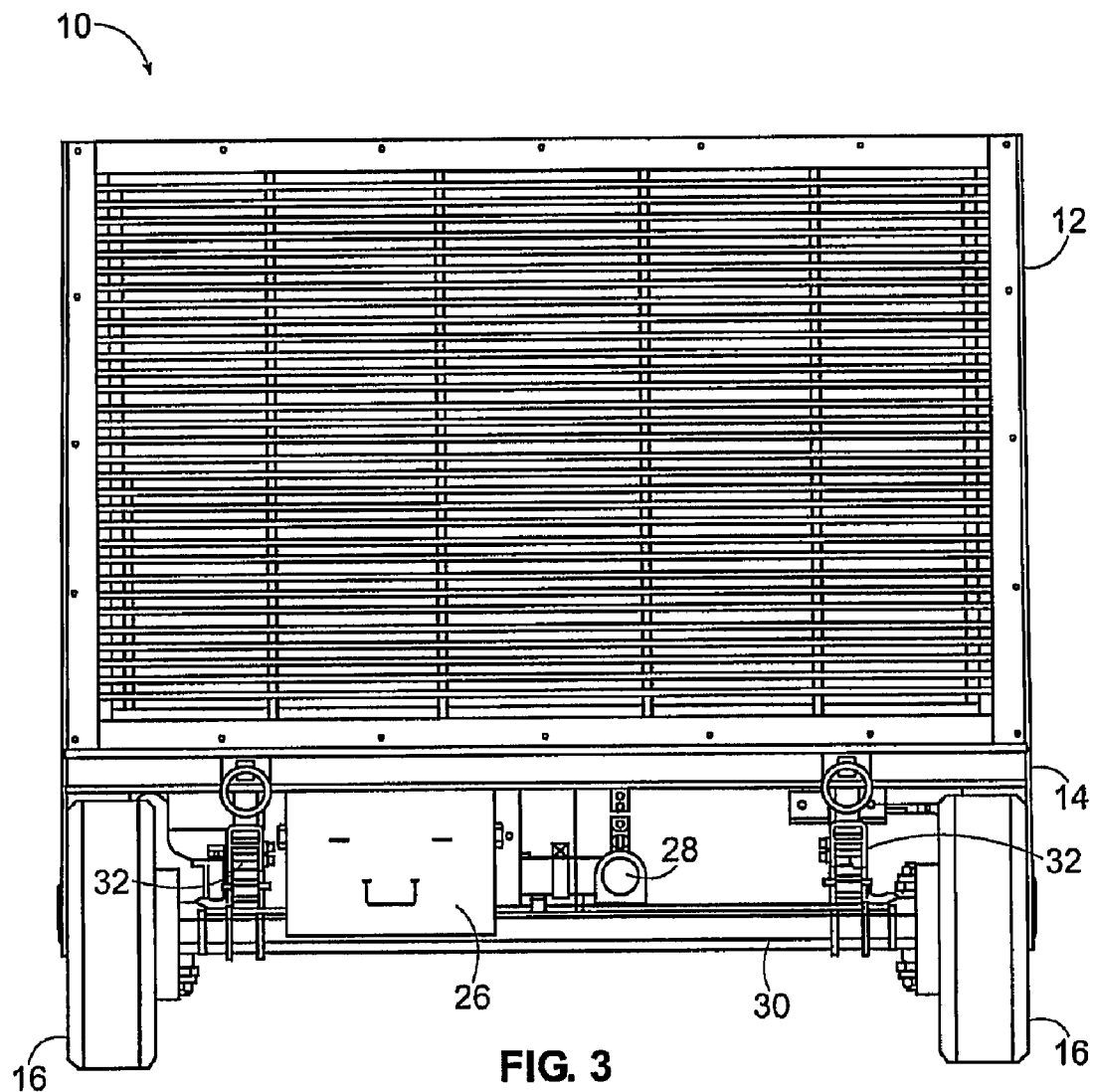
FIG. 3 illustrates an end view of a ground support equipment cart, according to an embodiment of the present invention.

FIG. 3 illustrates an end view of the ground support equipment cart 10. A battery box 26 may be mounted to the frame 14, while a muffler 28 extends from a rear of the cart 10. As shown in FIG. 3, the two wheels 16 may be rotatably connected through an axle 30, which may secure the wheels 16 to the frame 14 through shocks 32.

Figures 4, 5:
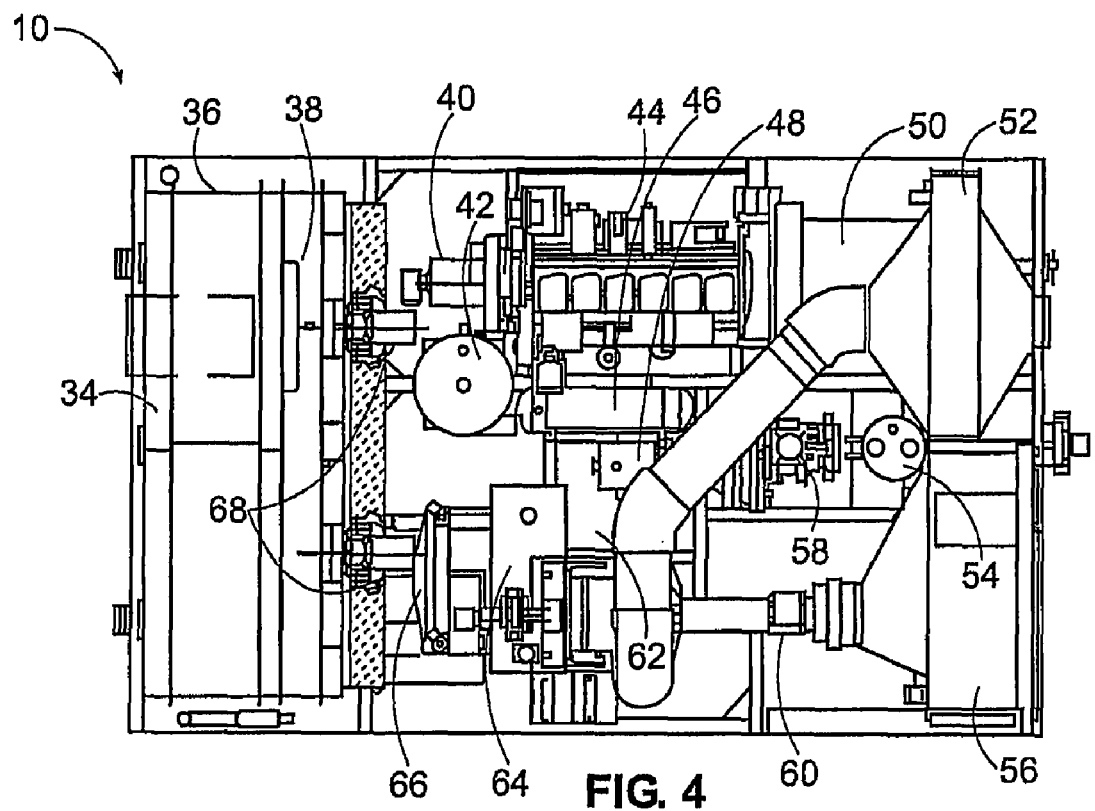
FIG. 4 illustrates an internal end view of a ground support equipment cart, according to an embodiment of the present invention.
FIG. 5 illustrates a lateral internal view of a ground support equipment cart, according to an embodiment of the present invention.

FIG. 4 illustrates an internal end view of the ground support equipment cart 10. As shown in FIG. 4, the cart 10 may include a variety of components designed to efficiently support aircraft while being serviced. The cart 10 may include a radiator, a condenser 36, an oil cooler 38, a hydraulic pump 40, an oil separator 42, an engine 44, a servo air tank 46, a compressor motor 48, a generator 50, an aftercooler evaporator 52, an accumulator 54, a precooler evaporator 56, a compressor 58, a damper actuator 60, a fuel tank 62, a hydraulic reservoir 64, a fluid cooler fan 66 and one or more fan drive motors 68.

FIG. 5 illustrates a lateral internal view of the ground support equipment cart 10. The cart may also include a fluid cooler 70, a reservoir filter 72, an electric blower motor 74, a blower 76, an air element 78 and a fan shroud 80. More or less components than those shown in FIGS. 4 and 5 may be used with the cart. For example, the cart 10 may be configured to supply fuel to an aircraft, in which case it may include a fuel pump and a fuel reservoir. A wide variety of ground support equipment may be included within the cart 10. Also, instead of a cart, embodiments of the present invention may be fixed within an aircraft hangar or other location at an airfield.

Figure 6:
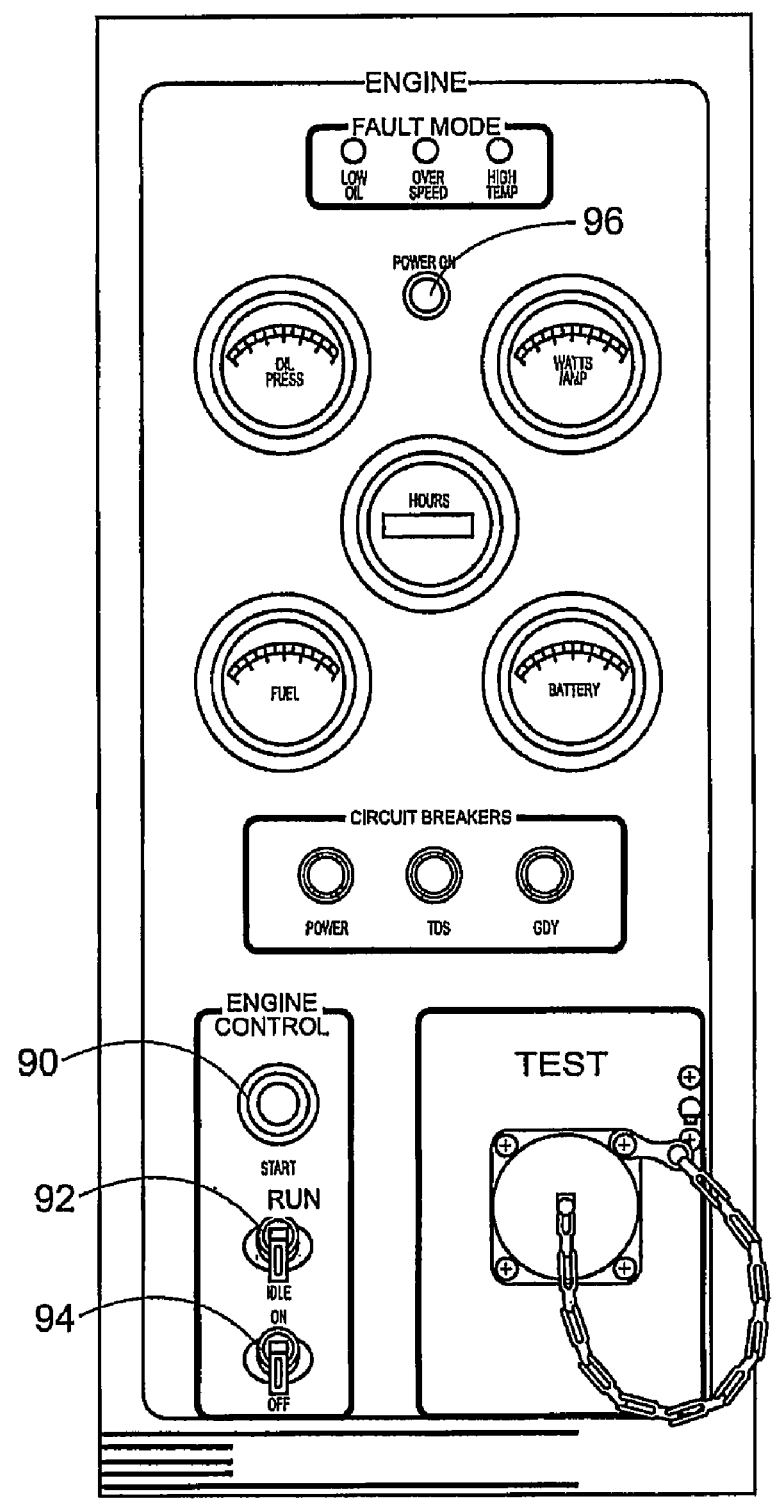
FIG. 6 illustrates a front view of a control panel for a ground support equipment cart, according to an embodiment of the present invention.

FIG. 6 illustrates a front view of the control panel 24 for the ground support equipment cart 10. The control panel 24 includes a plurality of acoustic wave switches 90, 92, 94 and 96 used to operate the cart 10. For example, acoustic wave switch 96 is used to activate and deactivate the service functions of the cart 10. A user merely touches the switch 96 to turn the cart 10 on. Similarly switches 90, 92 and 94 are used to control the engine of the cart 10. The switch 90 is configured to start and stop the engine, while the switch 92 is the ignition switch, and the switch 94 is the run/idle switch.

Figure 7:
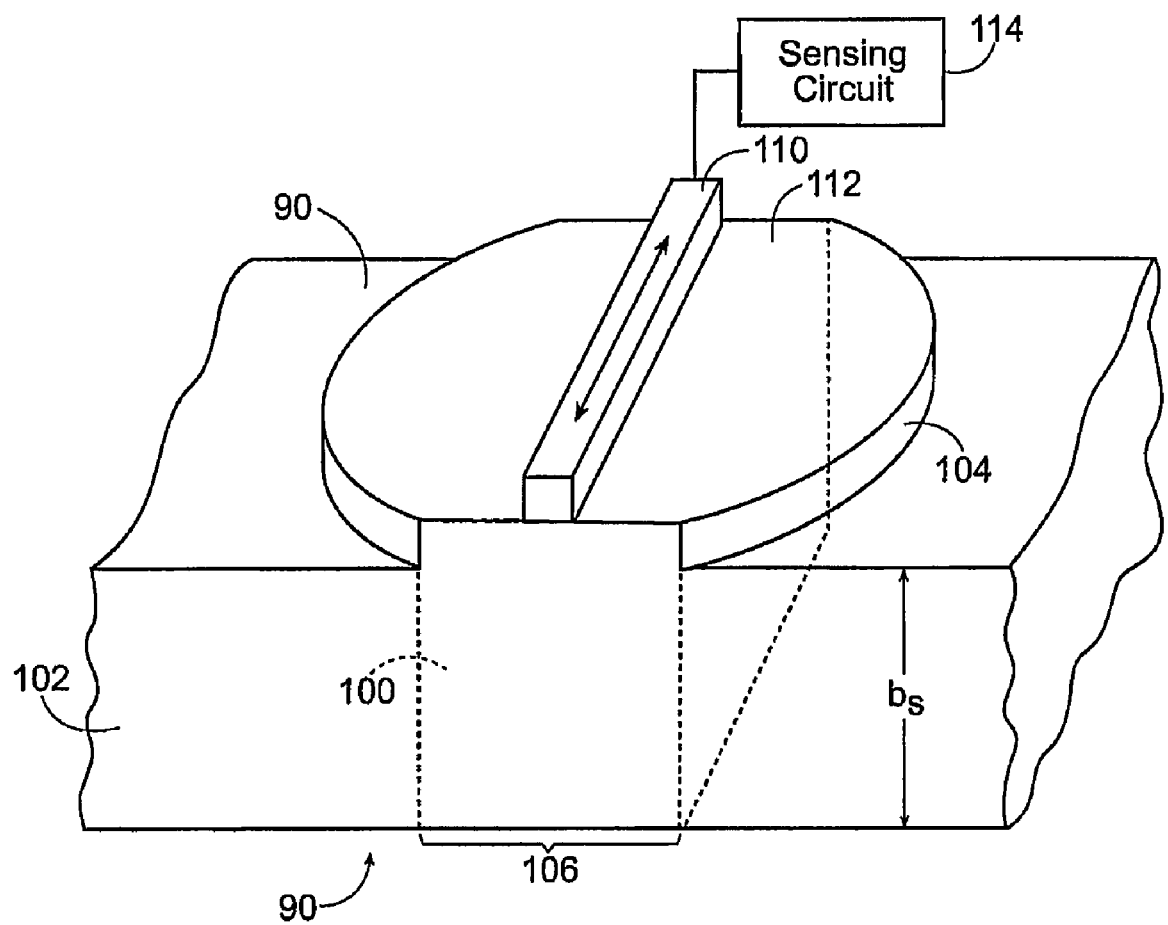
FIG. 7 illustrates an isometric, partial cross-sectional view of an acoustic wave switch of a ground support equipment cart, according to an embodiment of the present invention.

FIG. 7 illustrates an isometric, partial cross-sectional view of the acoustic wave switch 90 of the ground support equipment cart 10, according to an embodiment of the present invention. While FIG. 7 illustrates switch 90, the following description applies to all the switches 90, 92, 94 and 96 of the control panel 24.

In order to activate the various functions of the cart 10, an operator does not need to press the acoustic wave switch 90. Instead, the operator merely touches (i.e., moves his/her finger into contact with) the acoustic wave switch 90 or touches a cover positioned over the switch 90 so that the cover abuts the acoustic wave switch 90. A minimal amount of force is needed to engage the acoustic wave switch 90. Indeed, the operator only moves his/her finger into contact with a touch surface of the switch 90, as opposed to pressing (i.e., exerting a relatively large force intended to move) the switch 90. That is, an operator merely touches the active tough switch 90 so that a finger (or an underside of the cover) abuts a surface of the acoustic wave switch 90.

Alternatively, the switch 90 may be configured so that a certain amount of pressure is used to activate a service function of the cart 10 through the acoustic wave switch 90. That is, the acoustic wave switch 90 may be configured to selectively activate and deactivate a particular function through a touch that exceeds a particular amount of pressure. Contact below that pre-configured pressure would not cause activation or deactivation.

The acoustic wave switch 90 includes an associated acoustic wave cavity, or resonator, 100 that extends through the thickness $b_s$ of a substrate 102, which may be the main body of the switch 90 itself. The substrate 102 may be formed of metal, plastic, glass, ceramics, or the like that are capable of supporting a resonant acoustic wave.

The acoustic wave cavity 100 is formed in the substrate 102 such that the mass per unit surface area of the acoustic wave cavity 100 is greater than the mass per unit surface area of the substrate 102 adjacent the acoustic wave cavity 100. In one embodiment, the mass per unit area of the substrate 102 in the switch engagement region is increased to form the acoustic wave cavity 100 by forming a thin plateau or mesa 104 on a surface of the substrate 102 that is parallel to the plane of the substrate 102 and/or a touch surface 106, which is configured to be engaged by an operator. The mesa 104 may be formed on a back surface 108 of the substrate 102 opposite the touch surface 106 of the acoustic wave cavity 100. In general, the back surface 108 is secured within a receiving hole formed in the control panel 24 (shown in FIG. 6) and the touch surface 106 is exposed. Alternatively, the mesa 104 may be formed on the touch surface 106.

A transducer 110, which is located within the control panel 24, may be mounted on a surface 112 of the acoustic wave cavity 100 to generate an acoustic wave that is substantially trapped or localized within the acoustic wave cavity 100. Although the transducer 110 is shown as being mounted on the mesa 104, if the mesa 104 is formed on the touch surface 106 of the substrate 102, the transducer 110 may be mounted directly on the substrate surface of the acoustic wave cavity 100 opposite the mesa 104 so that the transducer 110 is on the backside of the substrate 102. When the acoustic wave switch 90 is secured within the control panel 24, the transducer 110 is electrically connected to a sensing circuit 114 or a separate processing unit within the cart 10. Each acoustic wave switch 90, 92, 94 and 96 may be connected to separate sensing circuits or the same sensing circuit.

The acoustic wave switch 90 may use any type of acoustic wave capable of being substantially trapped in the acoustic wave cavity 100. For simplicity, the acoustic wave switch 90 is described using a shear wave in a direction that is in the plane of the substrate 102, wherein the shear wave energy extends in a direction perpendicular to the plane of the substrate 102, that is, through the thickness of the substrate 102. A shear wave is advantageous because it is insensitive to liquids and other contaminants on the touch surface 106 of the acoustic wave switch 90. Because the fundamental or zeroth order mode of a horizontally polarized shear wave may not be substantially trapped, higher order shear wave modes are used in accordance with embodiments of the present invention. It should be appreciated that because the acoustic wave used is trapped, the wave is a standing wave. A standing wave has a number of advantages over an acoustic wave that propagates or travels along a path in a substrate. For example, propagating waves are not confined to the main path of propagation but can diffract off of the main path complicating touch detection. This is opposed to a standing wave which by its nature is confined to the area of a particular acoustic wave cavity 100. Because the acoustic wave is confined, touch detection is easily accomplished. Further, the wave energy of a propagating wave is not stored at any location along the path. Once the wave passes a point along the path, the wave is gone, thereby making timing and control critical for touch detection with propagating waves. There are no timing or control issues with a standing wave because the wave energy is stored in the acoustic wave cavity 100. Moreover, a propagating wave is not a resonating wave. As such, the wave energy decays as it travels. A standing wave is resonant so that the wave is reinforced and prolonged. As a result, the standing wave has a much greater amplitude than a wave that is not confined. The construction and operation of the acoustic wave cavity 100 is further described in U.S. Pat. No. 7,106,310, entitled "Acoustic Wave Touch Actuated Switch" (The "'310 patent"), which is hereby incorporated by reference in its entirety.

Embodiments of the present invention provide a system and method of detecting pressure and movement with respect to the touch surface 106 of the acoustic wave switch 90, using acoustic wave energy that employs trapped energy concepts to create localized mechanical resonator, or acoustic wave cavity 100. The '310 patent discloses an acoustic wave switch that includes a substrate with an acoustic wave cavity, or resonator, formed therein such that the mass per unit area of the acoustic cavity is greater than the mass per unit area of the substrate adjacent the acoustic cavity. A transducer is mounted on the acoustic cavity for generating an acoustic wave that is substantially trapped in the cavity. A touch on the touch surface of the acoustic cavity absorbs acoustic wave energy and produces a detectable change in the impedance of the transducer. Moreover, as a user touches the touch surface, the resonant frequency changes, which may be detected by the sensing circuit 114 and/or processing unit which is electrically connected to the transducer.

The acoustic wave switch 90 has a high Q (the ratio of the stored energy to lost or dissipated energy over a complete cycle) so as to enable a touch to be detected by extremely simple, low-cost circuitry. The acoustic wave switch 90 is rugged, explosion proof, operates in the presence of liquids and other contaminants, has a lower power consumption and may be incorporated and integrally formed in the control panel 24 of the ground support equipment cart 10.

The acoustic wave switch 90 may be connected to an extremely simple touch detection or sensing circuit 114, such as shown and described in the '310 patent. For example, the transducer 110 may be coupled to a multiplexer that sequentially couples the transducer 110 and its associated acoustic wave switch 90 to an oscillator, as discussed in the '310 patent. Embodiments of the present invention may detect a touch on the touch surface 106 through a detected change in impedance, as described in the '310 patent. Once a touch is detected, the particular function for the cart 10 (such as starting the engine) is activated if not previously activated or deactivated if previously running. Further, as described above, only a touch, but not a squeeze/press, is needed in order to activate/deactivate the functions of the cart 10. That is, a change in impedance is detected when contact is made with the touch surface 106. As noted above, however, the acoustic wave switches 90, 92, 94 and 96 may be configured to switch when a touch of a particular pressure is applied to the touch surface 106

Optionally, embodiments of the present invention may detect a touch on the touch surface 106 by measuring the decay time of the acoustic wave within the acoustic wave cavity 100. United States Patent Application Publication No. 2004/0246239, entitled "Acoustic Wave Touch Detection Circuit and Method" (the "'239 application") which is hereby incorporated by reference in its entirety, describes a controller that detects a sensed event such as a touch on an acoustic wave switch/sensor based on the decay time. The trapped acoustic wave within the acoustic cavity, or resonator, acts to "ring"

the acoustic cavity. That is, as a voltage is applied to the transducer, the transducer operates to resonate the acoustic cavity.

As described in the '239 application, the sensing circuit 114 operatively connected to the acoustic wave switch 90 may include a controller that drives the transducer 110 to generate a resonant acoustic wave in the acoustic wave cavity 100 during a first portion of a sampling cycle. In a second portion of the sampling cycle, the controller monitors the time that it takes for the acoustic wave signal from the transducer 110 to decay to a predetermined level. Based on the decay time, the controller detects a sensed event, such as a touch on the touch surface 106 of the acoustic wave switch 90.

Referring to FIGS. 1-7, the acoustic wave switches 90, 92, 94 and 96 formed on, and/or connected to, the control panel 24 of the cart 10 may be formed and operated similar to the acoustic wave switches shown and described in either the '310 patent or the '239 application. That is, instead of using mechanical switches that use springs, stems or the like, the touch surface 106 of each acoustic wave switch 90, 92, 94 and 96 is connected to, or part of, an acoustic wave cavity 100 or resonator operatively connected to the transducer 110. The shape and size of each touch surface 106 may be different than shown in FIG. 7.

The sensing circuit 114 may be integrated directly into the acoustic wave switch 90. The switch 90 itself may be a modular unit that may be removably secured within a receiving chamber of the control panel 24. Thus, a cart 10 may be retrofit with the acoustic wave switches 90, 92, 94 and 96. A conventional mechanical switch may be removed from the control panel 24, and one of the acoustic wave switches 90, 92, 94 or 96 may be positioned in its place. The sensing circuit 114 may be configured to provide the same type of activation signals as the conventional mechanical switch. In particular, the sensing circuit 114 may be in communication with the cart 10, and when a touch is detected on the touch surface 106, sends an activation or deactivation signal to the cart 10 (e.g., to the engine) with respect to a particular servicing function.

As discussed above, FIG. 7 is applicable to all of the switches 90, 92, 94 and 96 shown on the control panel 24 in FIG. 6. The switches 90, 92, 94 and 96 may be formed as buttons, indentations, or the like.

Embodiments of the present invention provide ground support equipment having acoustic wave switches that are not susceptible to the effects of moisture, debris and the elements, as opposed to conventional ground support equipment. Embodiments of the present invention do not require protective covers or sheets over the control panel due to the fact that the switches 90, 92, 94 and 96 are rugged, explosion proof and operate in the presence of liquids and other contaminants, unlike conventional ground support equipment. Unlike conventional ground support equipment, embodiments of the present invention do not include switches or buttons having a plurality of moving parts, such as springs, stems or the like, that are susceptible to malfunction, damage and general wear and tear over time, particularly in the presence of moisture, sand and debris.

The acoustic wave switches may be used with respect to control panels of various types of ground control equipment. For example, a fluid exchange or fueling cart may include a control panel having acoustic wave switches. Also, the ground support equipment may be fixed within a hangar or other location within an airfield.

Overall, embodiments of the present invention provide ground support equipment, such as a CGAC, that includes active touch switches and buttons that are water-proof and shock-proof. As such, the ground support equipment is more robust and durable than conventional ground support equipment. Additionally, the buttons and switches of the ground support equipment are resistant to sand and debris. Therefore, the ground support equipment does not require a transparent cover, and may be washed down easier and quicker than conventional ground support equipment. Additionally, embodiments of the present invention provide switches and buttons that are not susceptible to malfunction in the presence of applied chemicals (such as during a chemical sanitization process that occurs when ground support equipment is returned after deployment).

Moreover, the active touch switches and buttons of the ground support equipment incorporate predictive failure and/or self-diagnostic capability, which is an advantage over conventional mechanical switches. For example, an active touch switch that is not engaged by a user exhibits a particular predetermined and known impedance and/or decays at a known rate. If impedance/decay values vary from these particular known or calibrated quantities, an alert may be sent that the switch may be susceptible to malfunction in the present or future. The switches themselves may include processing units, or the system may include a main processing unit, that monitors the operational integrity of the acoustic wave switches.

As shown in FIG. 6, if a processing unit of the system 10 connected to the control panel 24 (or the switches themselves) determines that the main power acoustic wave switch 96 is malfunctioning or may malfunction in the future (through a detection of a variance with respect to known or calibrated quantities), the entire system 10 may shut down until the switch 96 is repaired. If, however, the defective switch relates to a non-essential function, the system 10 may still be operable. If the control panel 24 includes additional switch locations or a graphical touch screen, the defective switch location may be replaced with another functioning switch location. The ability to detect variances from known or calibrated quantities allows the system to self-diagnose problems or potential problems with the switches.

Also, typical mechanical switches may provide a location for electromagnetic interference (EMI) to escape from or enter the ground support equipment. Acoustic wave switches and buttons, such as shown in FIGS. 6 and 7, of the ground support equipment, however, eliminate gaps through which EMI may pass.

While embodiments of the present invention have been described with respect to ground support equipment, in general, and a CGAC, in particular, acoustic switches and buttons may be used with a wide variety of military equipment. For example, acoustic wave switches and buttons may be used on control panels of mobile or fixed hanger equipment. One such cart may have a display with acoustic wave bezel buttons used to interface with a controller. Further, acoustic wave switches and buttons may be used with control panels of generators and the like.

While various spatial and directional terms, such as top, bottom, lower, mid, lateral, horizontal, vertical, front and the like may used to describe embodiments of the present invention, it is understood that such terms are merely used with respect to the orientations shown in the drawings. The orientations may be inverted, rotated, or otherwise changed, such that an upper portion is a lower portion, and vice versa, horizontal becomes vertical, and the like.

Variations and modifications of the foregoing are within the scope of the present invention. It is understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention. The claims are to be construed to include alternative embodiments to the extent permitted by the prior art.

Various features of the invention are set forth in the following claims.

The invention claimed is:

1. A ground support system configured to support servicing of aircraft, the ground support system comprising:
a main body housing one or both of an engine and/or a blower;
a control panel that is used to control operation of said one or both of said engine and/or blower,
at least one acoustic wave engagement member positioned on said control panel, said at least one acoustic wave engagement member being configured to selectively activate and deactivate an engine or blower function when touched by an operator, wherein said at least one acoustic wave engagement member operates in the presence of moisture and debris; and
a processing unit that monitors said at least one acoustic wave engagement member for an error and/or potential error, wherein the error and/or potential error is determined through detecting an actual response and a known or calibrated response.

2. The ground support system of claim 1, wherein said at least one acoustic wave engagement member comprises one or both of a switch and/or a button.

3. The ground support system of claim 1, said at least one acoustic wave engagement member comprising:
a substrate having an acoustic wave cavity; and
a transducer mounted to said substrate, wherein said transducer is configured to generate a trapped acoustic wave within said acoustic wave cavity.

4. The ground support system of claim 1, said at least one acoustic wave engagement member comprising a sensing circuit that detects a change in one of impedance or decay rate of a trapped acoustic wave within said at least one acoustic wave engagement member in order to determine if said at least one acoustic wave engagement member is being touched.

5. The ground support system of claim 4, wherein said at least one acoustic wave engagement member is configured to switch between activated and deactivated states when said sensing circuit detects a touch of a predetermined pressure.

6. The ground support system of claim 1, wherein the ground support system is a combination air generator/air conditioner.

7. The ground support system of claim 1, wherein said control panel is devoid of a protective cover.

8. The ground support system of claim 1, wherein said at least one acoustic wave engagement member comprises a main power switch, and wherein said processing unit shuts down the ground support system when the processing unit determines that the main power switch is susceptible to malfunctioning.

9. The ground support system of claim 1, wherein said at least one acoustic wave engagement member comprises a plurality of acoustic wave members, and wherein said processing unit replaces a malfunctioning switch with a functioning switch.

10. A method of operating ground support equipment used to support aircraft servicing, the method comprising:
contacting a switch of a control panel through a touch;
detecting said contacting by measuring a change in impedance or decay rate of a trapped acoustic wave within an acoustic wave cavity of the switch;
activating a servicing function of the ground support equipment through said contacting when the servicing function is deactivated immediately prior to said contacting;
deactivating the servicing function of the ground support equipment through said contacting when the servicing function is activated immediately prior to said contacting; and
self-diagnosing a defective switch by detecting an actual response and a known or calibrated response.

11. The method of claim 10, wherein said contacting occurs without squeezing, flipping or pressing.

12. The method of claim 10, wherein said activating and deactivating occurs after a predetermined time of said contacting.

13. The method of claim 10, wherein said activating and deactivating occurs when said contacting exceeds a predetermined amount of pressure.

14. The method of claim 10, wherein the servicing function comprises one or more of supplying fuel, providing lubricants, cleaning the aircraft and/or exchanging fluids with the aircraft.

15. The method of claim 10, further comprising:
associating the switch with a main power switch;
determining that the main power switch is susceptible to malfunctioning; and
shutting down the ground support equipment based on said determining.

16. The method of claim 10, further comprising:
utilizing a plurality of switches; and
replacing a malfunctioning switch with a functioning switch.

17. A combination air generator/air conditioner (CGAC) configured to support servicing of aircraft, the CGAC comprising:
a main body housing an engine operatively connected to a fuel tank and a blower;
a control panel that is used to control activation/deactivation of the CGAC and operation of said engine,
a plurality of acoustic wave engagement members positioned on said control panel, each of said plurality of acoustic wave engagement members being a switch or a button, each of said plurality of acoustic wave engagement members comprising:
a substrate having an acoustic wave cavity; and
a transducer mounted to said substrate, wherein said transducer is configured to generate a trapped acoustic wave within said acoustic wave cavity, said plurality of acoustic wave members being configured to selectively activate and deactivate said engine when touched by an operator, wherein said plurality of acoustic wave engagement members operate in the presence of moisture and debris; and
a processing unit that monitors each of said plurality of acoustic wave engagement members for an error and/or potential error, wherein the error and/or potential error is determined through detecting an actual response and a known or calibrated response.

18. The CGAC of claim 17, each of said plurality of acoustic wave engagement members comprising a sensing circuit that detects a change in one of impedance or decay rate of a trapped acoustic wave within said at least one acoustic wave member in order to determine if said at least one acoustic wave member is being touched.

19. The CGAC of claim 18, wherein each of said plurality of acoustic wave engagement members is configured to switch between activated and deactivated states when said sensing circuit detects a touch of a predetermined pressure.

20. The CGAC of claim 17, wherein said control panel is devoid of a protective cover.

21. The CGAC of claim 17, wherein said plurality of acoustic wave engagement members comprises a main power switch, and wherein said processing unit shuts down the CGAC when the processing unit determines that the main power switch is susceptible to malfunctioning.

22. The CGAC of claim 17, wherein said processing unit replaces a malfunctioning switch with a functioning switch.

* * * * *